United States Patent
Gomez et al.

(10) Patent No.: US 7,072,633 B2
(45) Date of Patent: Jul. 4, 2006

(54) DOUBLE-CONVERSION TELEVISION TUNER USING A DELTA-SIGMA FRACTIONAL-N PLL

(75) Inventors: Ramon A Gomez, San Juan Capistrano, CA (US); Myles H Wakayama, Laguna Niguel, CA (US)

(73) Assignee: Broadcom Corporation, Irvine, CA (US)

(*) Notice: Subject to any disclaimer, the term of this patent is extended or adjusted under 35 U.S.C. 154(b) by 422 days.

(21) Appl. No.: 10/366,668

(22) Filed: Feb. 14, 2003

(65) Prior Publication Data
US 2003/0224748 A1    Dec. 4, 2003

Related U.S. Application Data

(60) Provisional application No. 60/384,076, filed on May 31, 2002.

(51) Int. Cl.
*H04B 1/06* (2006.01)
*H04B 7/00* (2006.01)

(52) U.S. Cl. ...................... 455/260; 455/315

(58) Field of Classification Search .......... 455/76, 455/255–260, 264–265, 314–316, 323; 375/373, 375/376; 331/1 R, 34, 1 A
See application file for complete search history.

(56) References Cited

U.S. PATENT DOCUMENTS

| | | | |
|---|---|---|---|
| 4,179,670 A | 12/1979 | Kingsbury | |
| 5,737,035 A | 4/1998 | Rotzoll | |
| 6,154,640 A * | 11/2000 | Itoh et al. | 455/76 |
| 6,177,964 B1 * | 1/2001 | Birleson et al. | 348/725 |

(Continued)

FOREIGN PATENT DOCUMENTS

WO    WO 01/20791 A1    3/2001

OTHER PUBLICATIONS

European Search Report for European Patent Application. No. 03012507.4-2215. 3 pages, published Jun. 4, 2004.

(Continued)

*Primary Examiner*—Nguyen T. Vo
(74) *Attorney, Agent, or Firm*—Sterne, Kessler, Goldstein & Fox P.L.L.C.

(57) ABSTRACT

A double-conversion tuner receives an RF signal having a number of channels and down-converts a selected channel from the plurality of channels. The double-conversion tuner includes a first mixer configured to up-convert the RF signal to a first IF signal using a first local oscillator signal. A first local oscillator includes a delta-sigma fractional-N phase lock loop to produce the first local oscillator signal. The delta-sigma fractional-N phase lock loop is configured to perform fine-tuning of the first local oscillator signal and to have a wide tuning range sufficient to cover the number of channels. A bandpass filter is configured to select a subset of channels from said first IF signal. A second mixer is configured to down-convert the subset of channels to a second IF signal using a second local oscillator signal. A second local oscillator generates the second local oscillator signal. The second local oscillator is configured to perform coarse frequency tuning of the second local oscillator signal and has a narrow tuning range relative to said first local oscillator. The delta-sigma fractional-N phase lock loop in the first local oscillator permits implementation of a double-conversion tuner with improved phase noise for a given amount of power and complexity.

29 Claims, 13 Drawing Sheets

U.S. PATENT DOCUMENTS

| | | | |
|---|---|---|---|
| 6,219,397 | B1 | 4/2001 | Park |
| 6,285,865 | B1* | 9/2001 | Vorenkamp et al. ........ 455/307 |
| 6,377,315 | B1 | 4/2002 | Carr et al. |
| 6,396,428 | B1 | 5/2002 | Cheng |
| 2003/0197564 | A1* | 10/2003 | Humphreys et al. .......... 331/11 |
| 2004/0164809 | A1* | 8/2004 | Gibbs ........................ 331/1 A |

OTHER PUBLICATIONS

Connell, L. et al., "A CMOS Broadband Tuner IC," *2002 IEEE International Solid-State Circuit Conference Digest of Technical Papers*, IEEE, vol. 45, pp. 400-401 (Feb. 2002).

Crawford, J.A., *Frequency Synthesizer Design Handbook*, Artech House, pp. vii-xi, 347-350, 387-393 and 395-406 (1994).

Gardner, F.M., Ph.D, *Phaselock Techniques*, Second Edition, John Wiley & Sons, pp. ix-xi and 208-211 (1979).

Norsworthy, S.R. et al. (Eds.), *Delta-Sigma Data Converters: Theory, Design, and Simulation*, IEEE Press, pp. v-xiv and 16-19 (1997).

Rhee, W. et al., "A 1.1-Ghz CMOS Fractional-N Frequency Synthesizer with a 3-b Third-Order $\Delta\Sigma$ Modulator," *IEEE Journal of Solid-State Circuits*, IEEE, vol. 35, No. 10, pp. 1453-1460 (Oct. 2000).

* cited by examiner

DOUBLE-CONVERSION TELEVISION TUNER USING A DELTA-SIGMA FRACTIONAL-N PLL

CROSS-REFERENCE TO RELATED APPLICATIONS

The present application claims the benefit of U.S. Provisional Patent Application 60/384,076 filed on May 31, 2002, which is incorporated by reference herein in its entirety.

BACKGROUND OF THE INVENTION

1. Field of the Invention

A double-conversion television tuner includes a Delta-Sigma Fractional-N Phase Lock Loop (PLL) to generate the first local oscillator signal. This arrangement permits finer frequency resolution with reduced phase noise, compared to existing approaches.

2. Background Art

In a double-conversion tuner, there are two local oscillators (LOs). It is possible to relax the requirements for each PLL by making the first LO cover a wide range in coarse steps, and the second LO cover only a narrow range but with all of the desired frequency resolution. The first and second LOs can be implemented using integer-N PLLs.

There is a fundamental tradeoff in integer-N PLLs between frequency resolution and phase noise performance. Generally, in an integer-N single-loop PLL, the loop bandwidth must be set to less than about one-tenth of the frequency step size in order to avoid stability problems. These problems arise because phase detectors used in PLLs generally sample the phase error at the reference frequency rate, which is equal to the step size in this type of PLL. Feedback control systems approach instability as the sampling rate is reduced towards the loop bandwidth. However, lowering the PLL loop bandwidth beyond some optimum point for compatibility with a lower sampling rate will increase the phase noise of the PLL, as the feedback action becomes progressively less able to track VCO phase fluctuations.

Various techniques have been developed to circumvent this limitation. One approach is to use multiple-loop PLLs as shown in FIG. 2. In these PLLs, the main loop 202 has only coarse frequency resolution. The feedback from the VCO 206 to the phase detector 204 is offset in frequency (using mixers 210 and filters 208) with the output of one or more additional PLLs 212 having fine frequency resolution. These additional PLLs 212 will generally cover a much smaller frequency range, or operate at much lower frequencies than the main loop 202. In this way, they can have reduced phase noise compared to a single-loop PLL covering the full desired range with fine resolution. The output frequency of the composite loop will be the reference frequency multiplied by the feedback divider ratio 214 in the main loop 202, summed with the offsetting terms from the additional PLLs 212.

Another class of techniques involves dithering the feedback divider modulus of a single-loop PLL. In this way, an average feedback modulus that is intermediate between two integers can be obtained. The problem to overcome in these approaches is the phase modulation introduced on the PLL output due to dithering. FIG. 3 illustrates one common technique to remove this unwanted phase modulation. In FIG. 3, a dithering circuit 306 generates a canceling signal for the known modulation present at the output of the phase detector 302. This can be accomplished by driving a digital-to-analog converter (DAC) 304 with an appropriate digital signal related to the dithering pattern, and summing the DAC 304 output (with appropriate phasing) with the phase detector 302 output. To be effective, however, the DAC 304 and phase detector 302 transfer functions have to be linear and matched to a high degree.

In a double-conversion tuner, there are two LO signals that can be generated by corresponding PLLs. It is possible to relax the requirements for each PLL by making the first LO cover a wide range in coarse steps, and the second LO cover only a narrow range in fine steps but with all of the desired frequency resolution.

The coarse-fine approach, although capable of providing good phase noise performance, is still somewhat limited by the need for fine frequency resolution in the second LO. The multiple-loop approach is disadvantageous because of its complexity. What is needed is a PLL for a double-conversion tuner that permits finer frequency resolution with reduced phase noise, compared to existing approaches.

BRIEF SUMMARY OF THE INVENTION

A double-conversion tuner receives a radio frequency (RF) signal having a number of channels and down-converts a selected channel from the plurality of channels. The double-conversion tuner includes a first mixer configured to up-convert the RF signal to a first intermediate frequency (IF) signal using a first LO signal. A first LO includes a delta-sigma fractional-N phase lock loop to produce the first LO signal. The delta-sigma fractional-N phase lock loop is configured to perform fine-tuning of the first LO signal and to have a wide tuning range sufficient to cover the number of channels. A bandpass filter is configured to select a subset of channels from said first IF signal. A second mixer is configured to down-convert the subset of channels to a second IF signal using a second LO signal. A second LO generates the second LO signal. The second LO is configured to perform coarse frequency tuning of the second LO signal and has a narrow tuning range relative to said first LO. The delta-sigma fractional-N phase lock loop in the first LO permits implementation of a double-conversion tuner with improved phase noise for a given amount of power and complexity.

BRIEF DESCRIPTION OF THE DRAWINGS/FIGURES

DETAILED DESCRIPTION OF THE INVENTION

Figure 1:
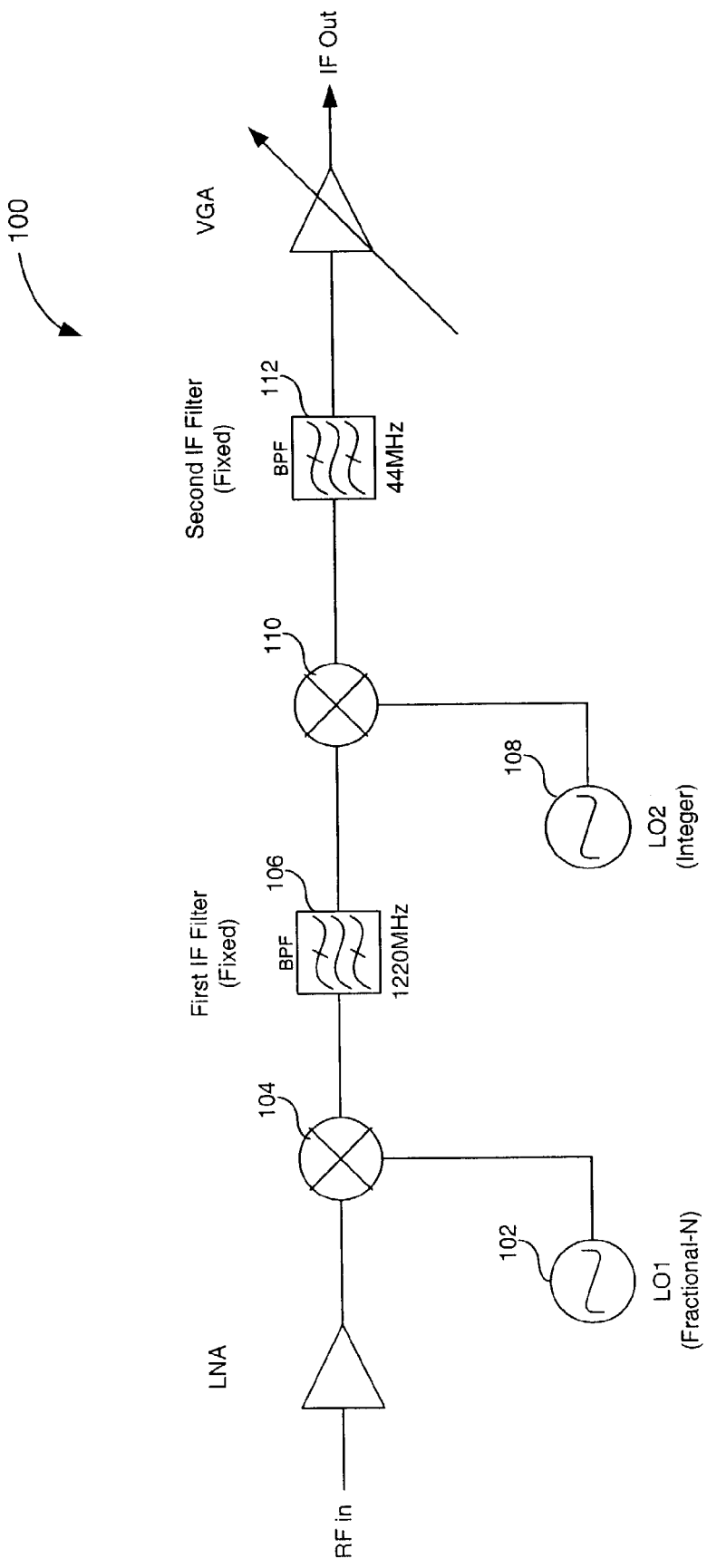
FIG. 1 illustrates a double-conversion tuner with a fractional-N phase lock loop as the first local oscillator.
Figure 2:
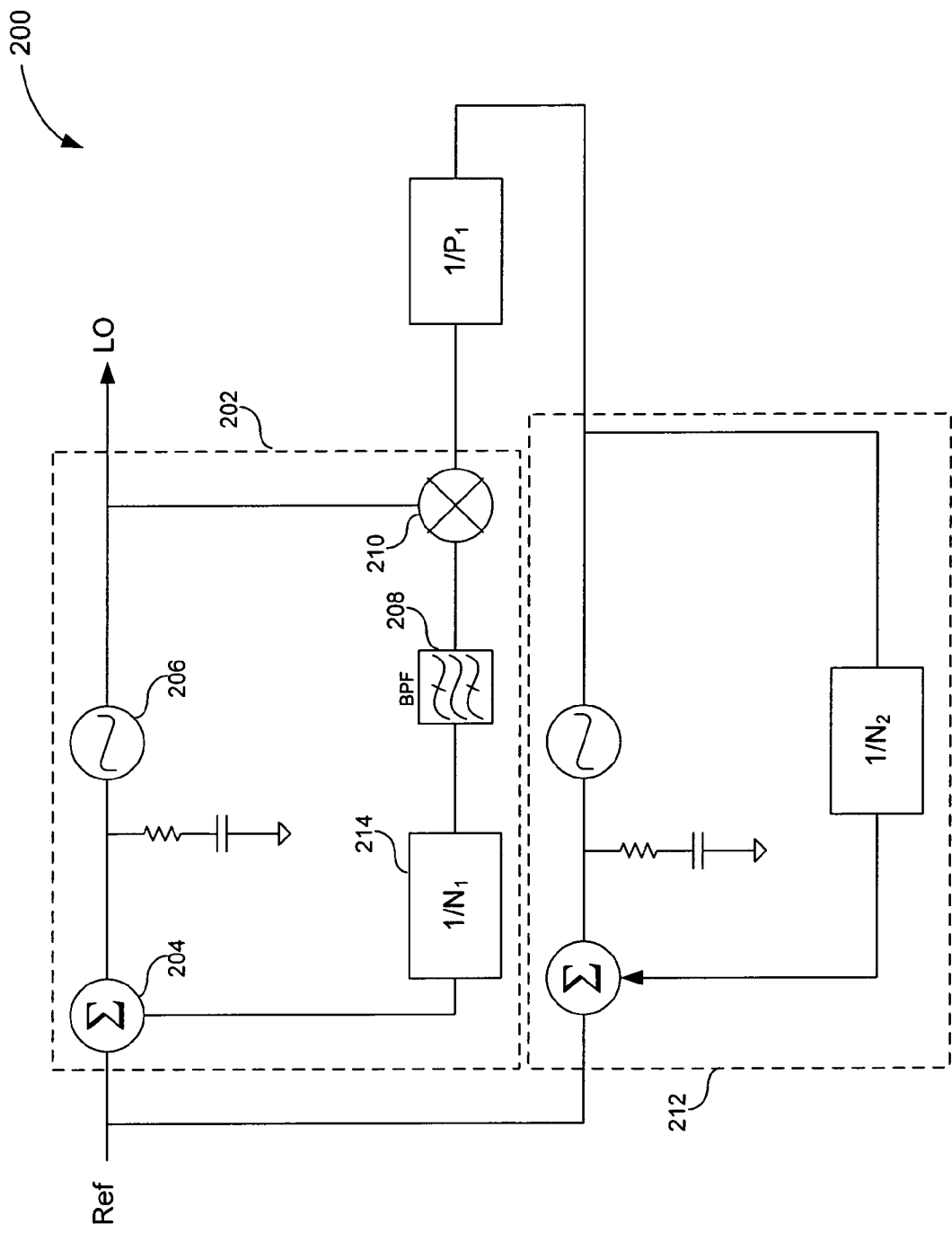
FIG. 2 illustrates a multiple-loop phase lock loop.

FIG. 1 illustrates a double-conversion tuner 100 with a fractional-N phase lock loop, according to embodiments of the present invention. The tuner 100 can be, for example, a television tuner that selects a desired channel from a number of channels in a received RF signal.

The tuner 100 includes a first LO 102, a first mixer 104, a first bandpass filter 106, a second LO 108, a second mixer 110, and a second bandpass filter 112. The first mixer 104 up-converts a received RF signal having a number of channels using the first LO 102 to a first IF signal. The bandpass filter 106 selects a subset of channels from the first IF signal. The second mixer 110 down-converts the selected channels from the output of the first bandpass filter 106 to a second IF signal by mixing with the second LO 108. Finally, the second bandpass filter 112 selects a single desired channel from the output of the second mixer 110.

The first LO 102 includes a fractional-N frequency divider which enables fine frequency tuning by the first LO 102. The second LO 108 includes an integer-N PLL so that the second LO is used for coarse frequency tuning. For example, the first LO 102 can provide fine frequency tuning to up-convert the desired channel to the approximate center of the bandpass filter 106. The second LO 108 is then tuned so that any mixer spurious signals are avoided depending on the relative location of the desired channel in the television frequency band.

Television tuners are further described in U.S. Pat. No. 6,377,315, which is incorporated herein by reference.

In one embodiment of the invention, a delta-sigma fractional-N PLL is used for the first LO 102, and a narrow range PLL with coarse steps is used for the second LO 108. The delta-sigma fractional-N PLL has a wide tuning bandwidth that is sufficient to cover the television band. The delta-sigma fractional-N PLL loop has a wide loop bandwidth that can be optimized to reduce (or minimize) phase noise, and also provides whatever frequency resolution is required for the double conversion. The second loop has a small number of steps available for overcoming various limitations of the fractional-N loop and the double-conversion architecture. The limitations of the fractional-N PLL are typically the presence of spurious modulation tones or excessive modulation noise at certain fractions, which can be expressed as the ratio of two small integers. The limitation of the double-conversion architecture is the presence of spurious tones, due to beats between the two LO frequencies or other undesired mixing products. These spurious tones or bad phase noise regions can be avoided by changing the second LO frequency slightly. A small number of steps for the second LO are sufficient to avoid these unwanted spurious tones or bad phase noise regions.

To summarize, the loop bandwidth of the fractional N delta-sigma PLL can be optimized to reduce or minimize the phase noise double conversion tuner. However, this may create unwanted mixer spurs that can be avoided by coarsely tuning the second LO.

Figure 4:
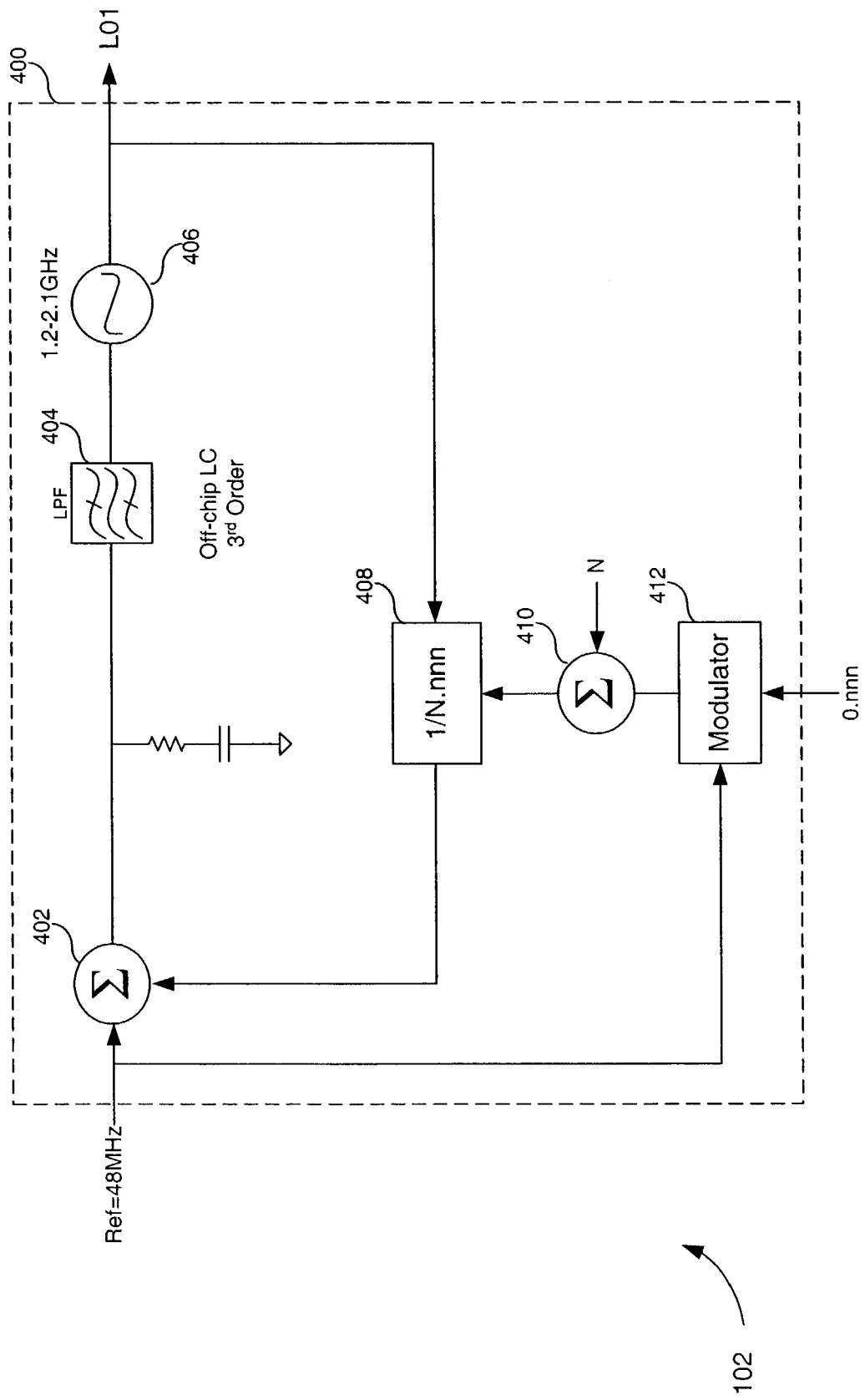
FIG. 4 illustrates delta-sigma fractional-N phase lock loop.

FIG. 4 illustrates a delta-sigma fractional-N PLL 400 that is one embodiment of the first LO 102. The delta-sigma fractional-N PLL 400 includes a phase detector 402, a low pass filter 404, a VCO 406, and a divider 408. The divider 408 is driven by a delta-sigma modulator 412, and a summer 410. The delta-sigma modulator 412 generates an average fractional value between −1 and 1, based on the desired fractional input 0.nnn. More specifically, the delta-sigma modulator 412 generates the values of either −1, 0, or 1 at any instant in time. However, these values can be varied over time to generate an average fractional output value that is output to the summer 410. For example, the delta-sigma modulator 412 can generate 0.6 by varying the output between 0 and 1, over time. The summer 410 adds an integer value of N to the fractional output of the modulator 412, to get a fractional number greater than 1 (e.g., 5.6, where N=5 and fractional delta-sigma output is 0.6) to control the divider 408. Therefore, the divider 408 can perform fractional frequency division (e.g., dividing by 5.6, instead of just 5 or 6). Delta-sigma modulators are further described in J. A. Crawford, *Frequency Design Handbook*, Artech House, Boston, 1994, which is incorporated herein by reference in its entirety.

The fractional divider 408 allows for relatively fine frequency tuning of the LO1, and if a wide loop bandwidth is selected for the low pass filter 404, then the phase noise will also be minimized. Unwanted mixer spurs can be avoided by coarse tuning the second LO 108.

The delta-sigma modulator 412 will suppress the modulation noise at low frequencies in the fractional-N PLL 400. By using a high-order loop filter 404, the modulation noise at high frequencies can also be suppressed. In other words, the loop filter 404 will set the loop bandwidth such that the high frequency noise will be outside of the loop bandwidth of the PLL 400. Therefore, the linearity requirement for the phase detector 402 is greatly eased. All fractional-N approaches can provide extremely fine frequency resolution for little added complexity, once the fundamental problem of modulation suppression is solved.

Figure 5:
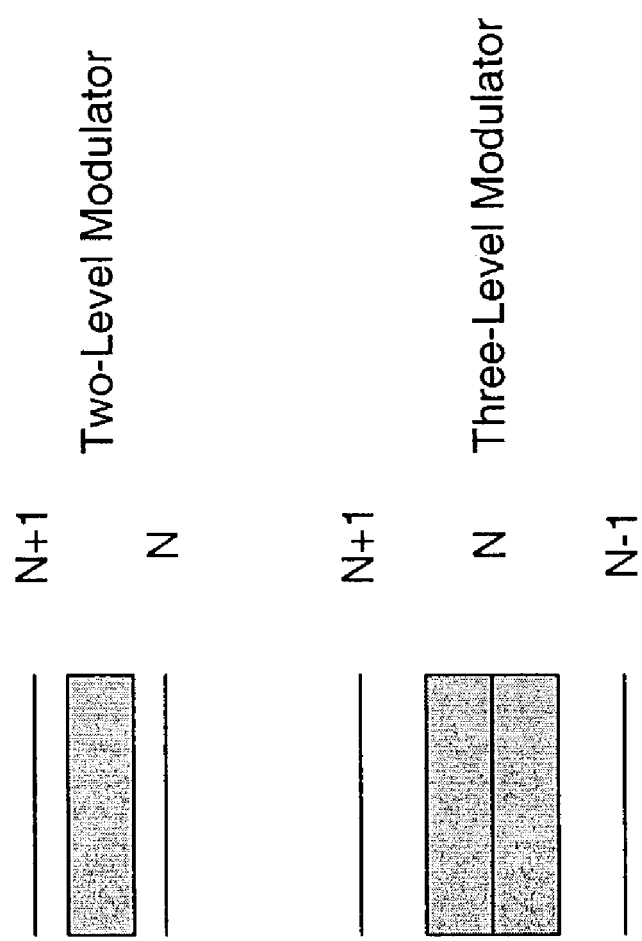
FIG. 5 illustrates 3 level vs. 2 level quantization in a delta-sigma modulator.

As discussed above, three-level quantization is used for the delta-sigma modulator 412 in this invention. In the context of a fractional-N PLL, this means that up to three adjacent integer ratios may be involved in the dithering, to obtain a fractional frequency intermediate between the highest and lowest integer frequencies. For example, as discussed above, the three integers may be −1, 0, and 1, as shown in FIG. 5. At least three levels of quantization are utilized because a modulator based on two-level quantization (i.e., two adjacent integers) cannot provide acceptable noise performance over a single integer step. Noise performance in a delta-sigma modulator is further discussed in S. R. Norsworthy et al, *Delta-Sigma Data Converters: Theory, Design, and Simulation*, IEEE Press, 1997, pp. 16–19, which is incorporated herein by reference in its entirety. The fractional frequencies close to the two adjacent integers in this case would be excessively noisy. By using three adjacent integers, acceptable performance can be obtained over somewhat more than a single integer step. For example, if the PLL is dithering between feedback ratios 10, 11 and 12, frequencies between 10.5 and 11.5 times the reference frequency will be acceptable.

Figure 3:
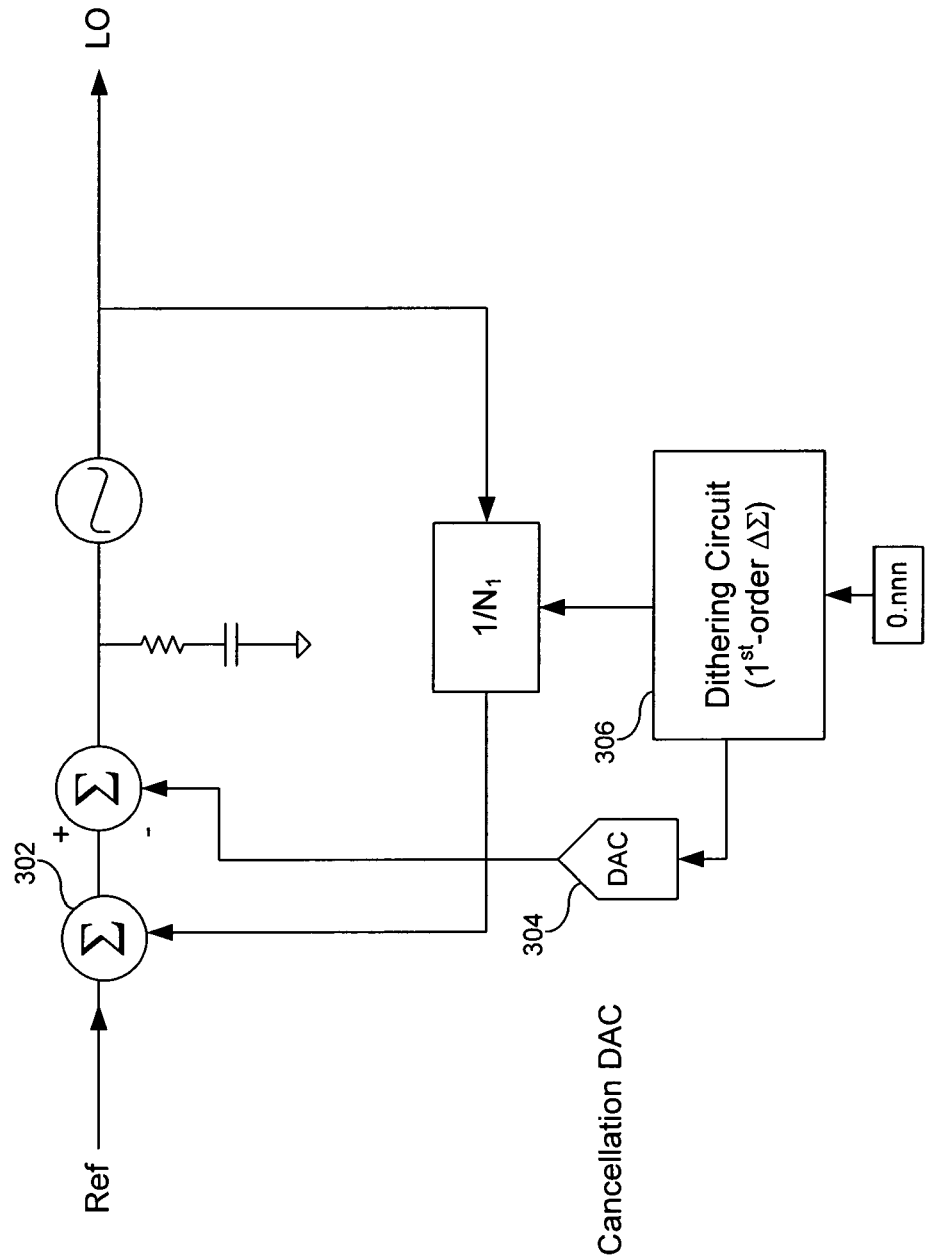
FIG. 3 illustrates a cancellation type phase lock loop.
Figure 6:
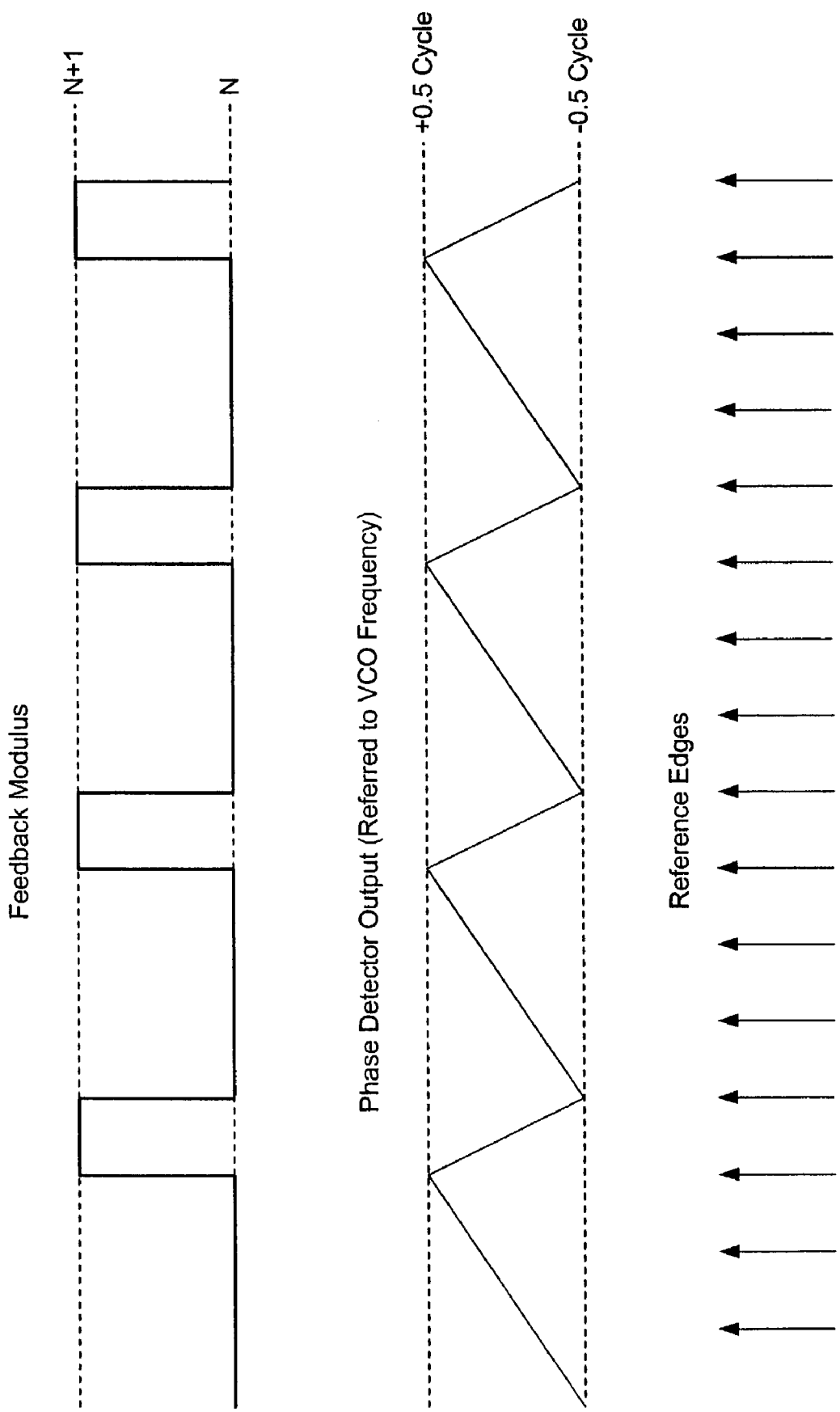
FIG. 6 illustrates phase error in a cancellation type fractional-N PLL.

Delta-sigma approaches reduce phase detector linearity requirements when compared to cancellation-based fractional-N approaches (FIG. 3). In a conventional cancellation-based approach, the peak phase error is on the order of one cycle. See FIG. 6 and J. A. Crawford, *Frequency Design Handbook*, Artech House, Boston, 1994, pp. 395–406, for example, which is incorporated herein by reference. Without cancellation, if the frequency desired is very close to an integer (specifically, if the fractional part of the frequency is less than the PLL loop bandwidth, so that the loop does not filter the modulation), the spurious level due to modulation will be on the order of 0 dBc. The DAC 304 and phase detector 302 in FIG. 3 must be linear and matched to, say, 60 dB, or about 10 bits, for −60 dBc spurious performance. This is a very severe requirement.

Figure 7:
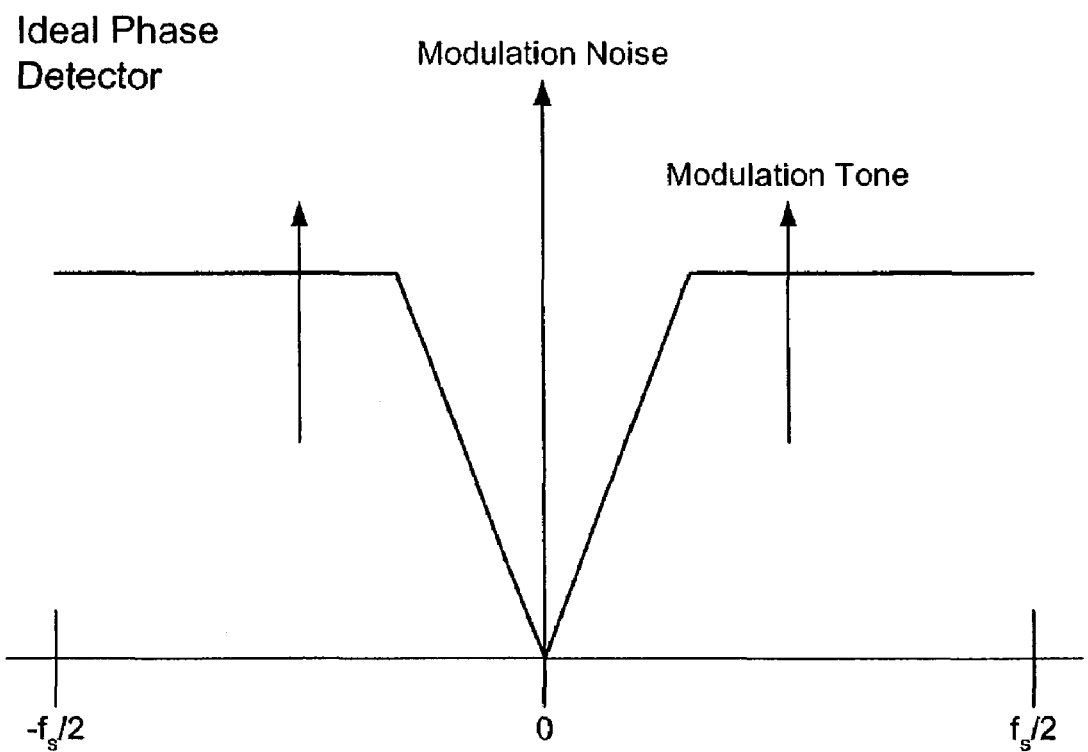
FIG. 7 illustrates noise folding in a delta-sigma fractional-N PLL.
Figure 7:
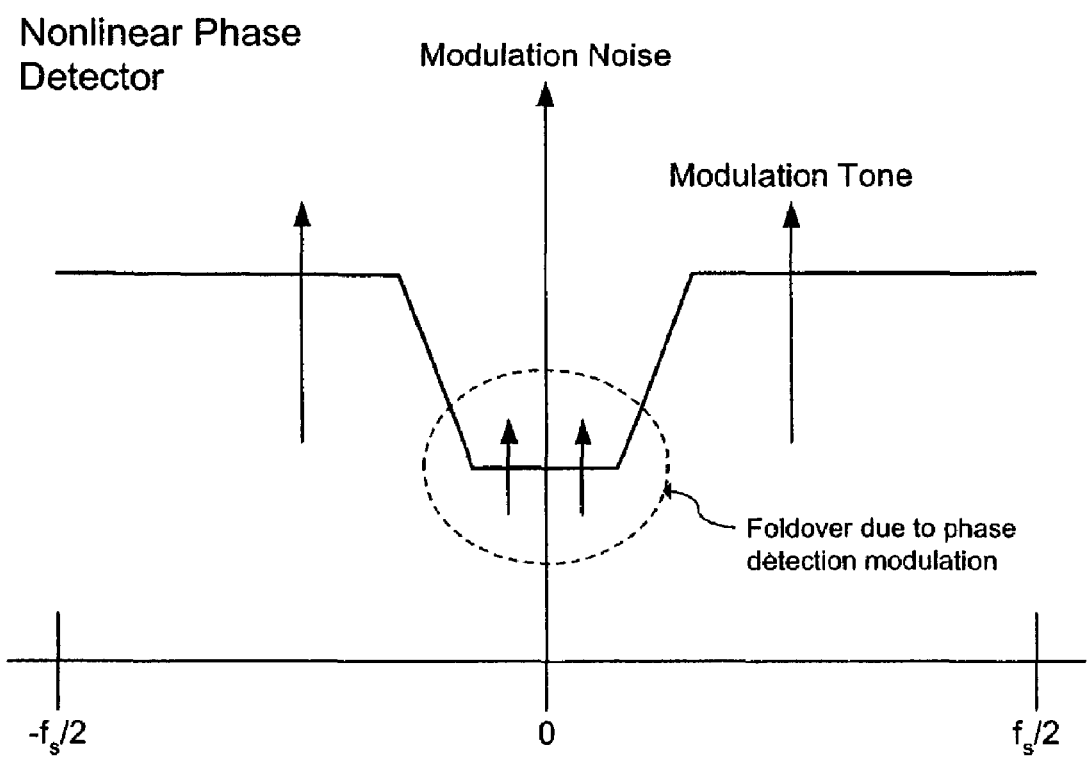

However, in a delta-sigma fractional-N loop, the modulation noise is smoothly spread out through the Nyquist band. The total amplitude of this modulation is still on the order of one cycle. If the phase detector 402 is perfectly linear, the modulation noise will be entirely pushed out beyond the loop bandwidth. However, if the phase detector 402 is not perfectly linear, mixing can take place between out-of-band discrete tones and quantization noise in the modulator spectrum. These discrete tones can have amplitude on the order of one cycle as well (before they are suppressed by the loop filtering 404). Therefore, if the phase detector 402 has, say, 40 dB linearity, the high frequency modulation noise may be translated to the near-carrier region with an attenuation of 40 dB. However, the total modulation will be −40 dBc+10 $\log_{10}$(2*loop bandwidth/ Nyquist bandwidth). The Nyquist bandwidth is, of course, the same as the reference frequency, which will be much larger than the loop bandwidth. In this implementation, the ratio of the loop bandwidth to the reference frequency is about 1/500, or 27 dB. Modulation noise foldover is further illustrated in FIG. 7.

Figure 8:
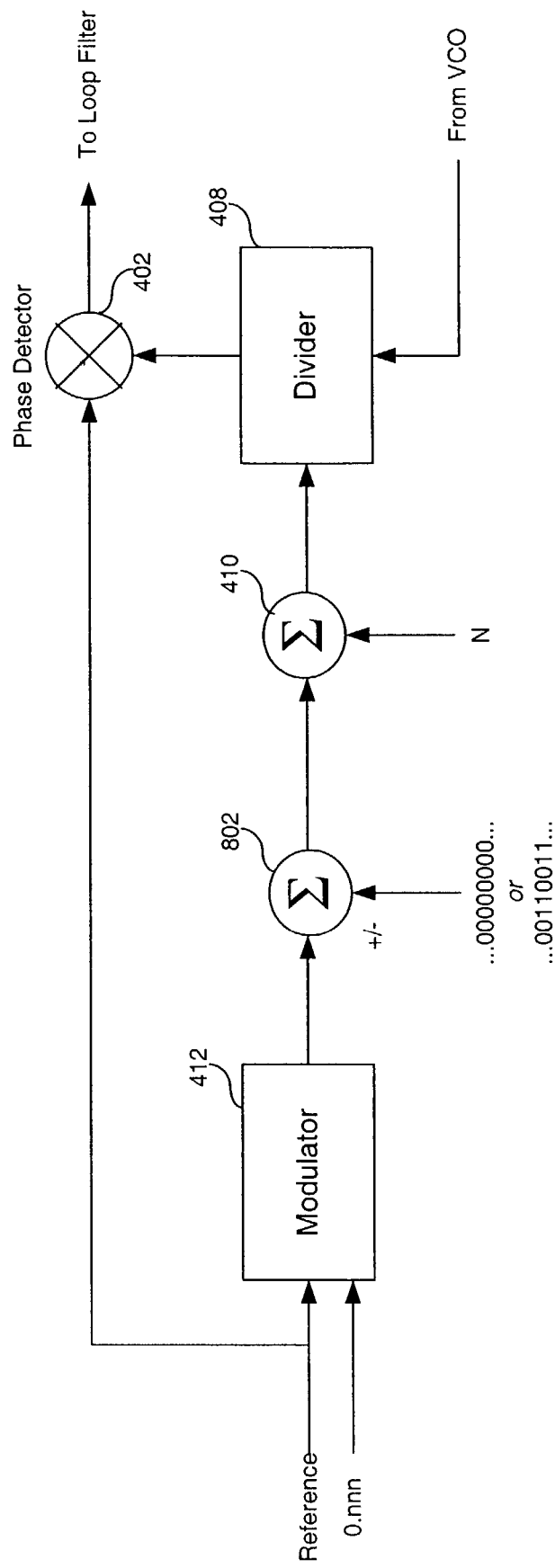
FIG. 8 illustrates the use of a periodic offset pattern applied to avoid modulator dead zone.

Nevertheless, it may be difficult to obtain more than 20 or 30 dB phase detector linearity. Typically, the noise translation problem is most severe near the middle integer frequency when three consecutive integers are used for the dithering. In this region, the modulator 412 is very inactive, producing a stream of mostly zeros. Even an ideal delta-sigma system, with a perfectly linear quantizer, performs more poorly in this region. To circumvent this problem, a 50% duty cycle stream of (0, +1) or (0, −1) is added to the modulator output stream. This gives offsets of +0.5 or −0.5, respectively. The modulator can then be programmed to produce sequences with average values of N−0.5 and N+0.5, respectively, to obtain bitstreams with average values near N. These bitstreams are highly active, dithering between the three consecutive integers N−1, N, and N+1, and have reduced noise. For example, FIG. 8 illustrates a summer 802 that is inserted between the delta-sigma modulator 412 and the summer 410. The summer 802 adds the 50% duty cycle stream of (0, +1) or (0, −1) to the modulator output 412.

Figure 9:
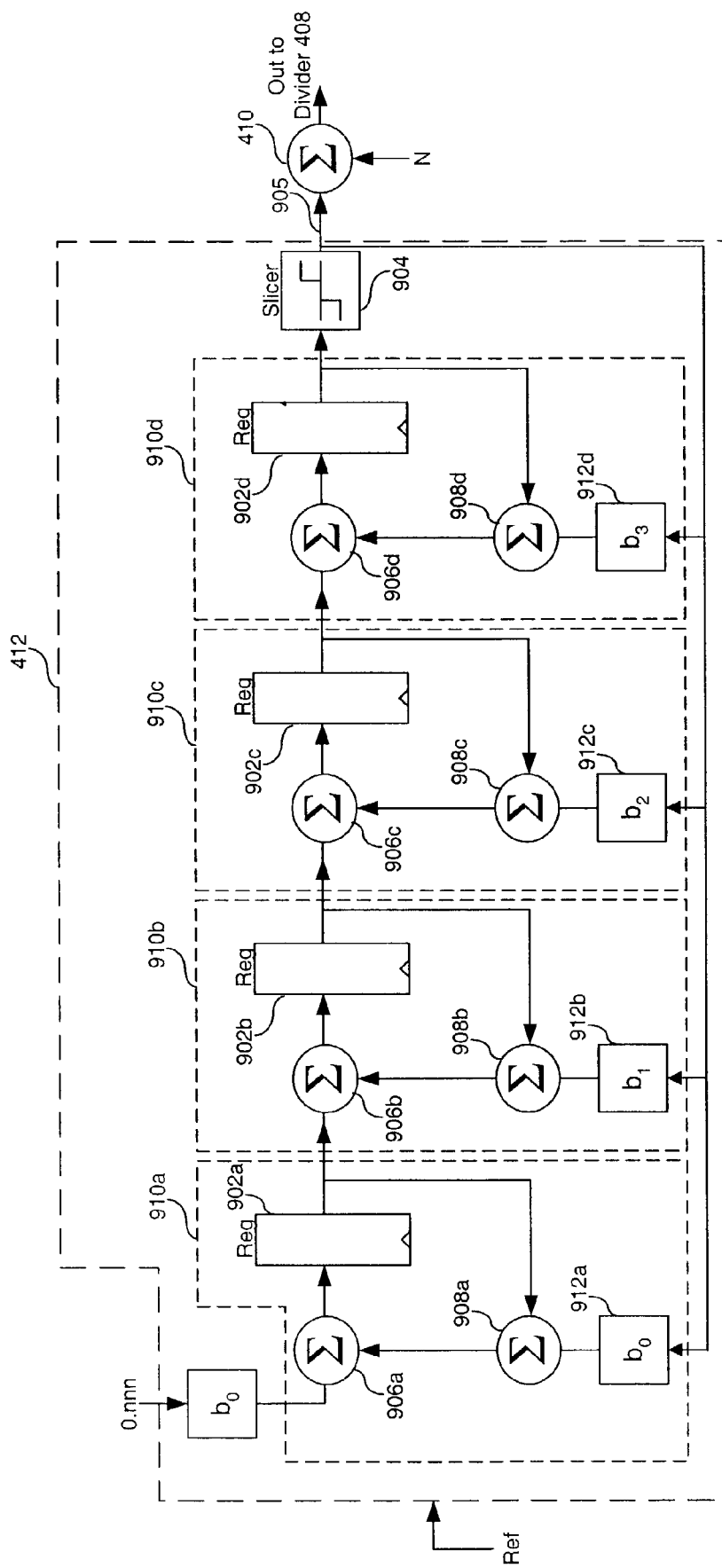
FIG. 9 illustrates a delta-sigma modulator using only −1/0/1 multiplication.

In one embodiment, the delta-sigma modulator 412 (from FIG. 4 and FIG. 8) is implemented as shown in FIG. 9. The modulator 412 in FIG. 9 includes a number of stages 910. Each stage 910 includes a register 902, a slicer 904, summers 906 and 908, and a multiplier 912. The modulator 412 is not limited to the number of stages shown in FIG. 9.

The modulator 412 receives a static fractional value 0.nnn and generates an average pulse output 905 that converges to 0.nnn over time. The integer value N is added at 410 to the average pulse output 905 and sent on to the divider 408. The DC gain of this modulator 412 is very large, but can be easily compensated by scaling the input appropriately.

During operation, the slicer 904 quantizes the output of the last register 902d to the three output levels −1, 0, and 1 to produce the quantized output 905. The quantized output 905 is fed back to coefficients $b_0$ to $b_3$ in stages 910, and multiplied by the coefficients $b_0$ to $b_3$ at the multipliers 912. Each summer 908 sums the output of multiplier 912 with the output of the corresponding register 902. Summer 906 sums the output of each summer 908 with the output of the register 902 from the preceding stage 910. In the case of the first register, the result of the multiplication by coefficient $b_0$ and the subsequent summing with the output of the corresponding first register is then summed with fractional value 0.nnn multiplied by coefficient $b_0$.

Multipliers 912 perform multiplications by −1, 0, and 1, since the output of slicer 904 is limited to this. Therefore, the amount of hardware is minimized since there are no fractional multipliers needed. As such, the additional power and die area contributed by the delta sigma modulator to an integrated tuner is minimal.

Figure 10:
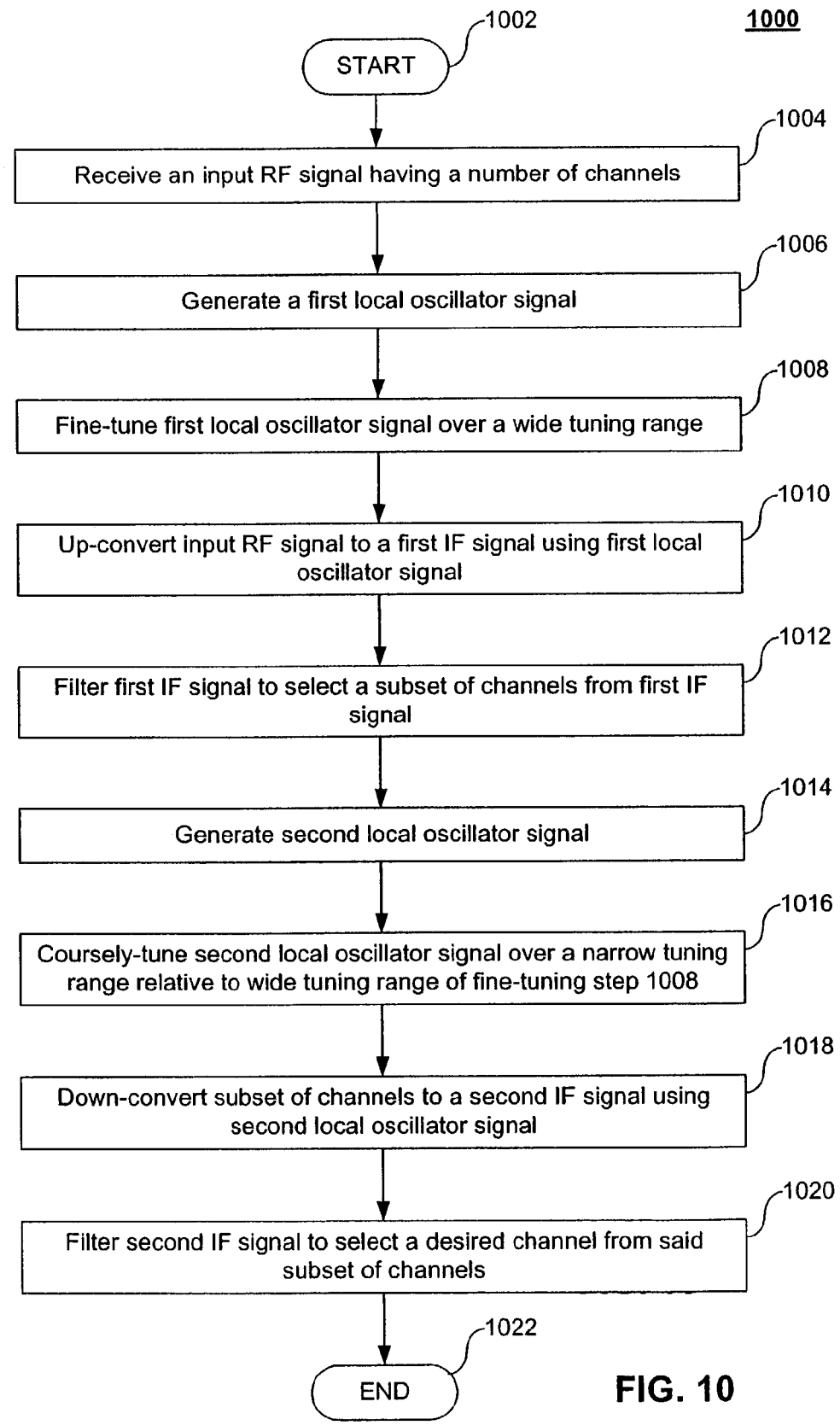
FIG. 10 illustrates double conversion tuning according to embodiments of the present invention.

FIG. 10 illustrates the double-conversion tuning method used by the above described apparatus. The method starts at step 1002 and is immediately followed by step 1004. In step 1004, the tuner receives an input RF signal having a number of channels. A first LO signal is generated in step 1006. In step 1008, the first LO signal is fine-tuned over a wide tuning range. In one embodiment of the invention, this is done using a delta-sigma fractional-N PLL that includes a fractional-N frequency divider to enable fine frequency tuning. The RF signal is then up-converted in step 1010 to a first IF signal using the first LO signal. In step 1012, the first IF signal is filtered to select a subset of channels from the first IF signal. A second LO signal is generated in step 1014. In step 1016, the second LO signal is coarsely-tuned over a narrow tuning range relative to the wide tuning range of step 1008. In one embodiment of the invention, this is done using an integer-N PLL. In step 1018, the subset of channels is down-converted to a second IF signal using the second LO signal for coarse-tuning. In step 1020, the second IF signal is filtered to select a desired channel from the subset of channels. In step 1022, the double-conversion tuning method terminates.

More specifically, the first LO can provide fine frequency tuning to up-convert the desired channel to the approximate center of a bandpass filter. The second LO is then tuned so that any mixer spurious signals are avoided depending on the relative location of the selected channel in the television frequency band.

Figure 11:
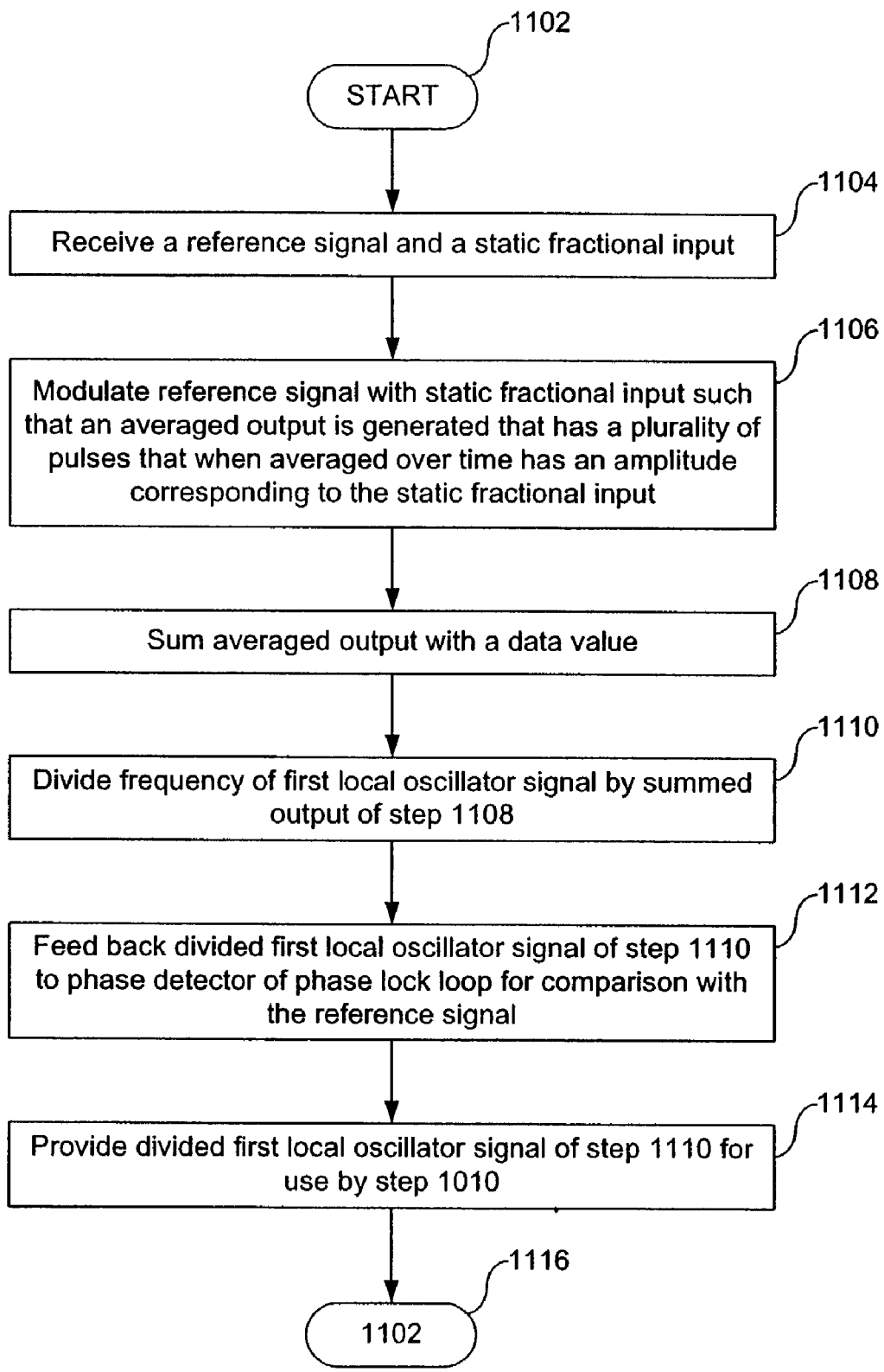
FIG. 11 illustrates fine tuning the first local oscillator signal according to embodiments of the present invention.

Method step 1008, the fine-tuning step, is further illustrated in FIG. 11. The fine-tuning method starts at step 1102, and immediately proceeds to step 1104. As stated previously, in one embodiment of the invention, fine-tuning is done using a delta-sigma fractional-N PLL. In step 1104, the PLL receives a reference signal and a static fractional input. In step 1106, the reference signal is modulated with the static fractional input such that an averaged output is generated that has a plurality of pulses that when averaged over time has an amplitude corresponding to the static fractional input. This averaged output is then summed with a data value in step 1108. In one embodiment, the data value is an integer. In another embodiment, the data value is a 50% duty cycle stream of (0, +1) or (0, −1), used to avoid the modular dead zone described previously in reference to FIG. 8. In yet another embodiment, the data value is a combination of an integer and a 50% duty cycle stream of (0, +1) or (0, −1). In step 1110, the frequency of the first LO signal is divided by the result of step 1108. In step 1112, the divided first LO signal is fed back to the phase detector for comparison with the reference signal. In step 1114, the fine-tuned first local oscillator signal of step 1110 is provided for use by step 1010. Process 1008 is then repeated at step 1116, starting back at step 1102.

Figure 12:
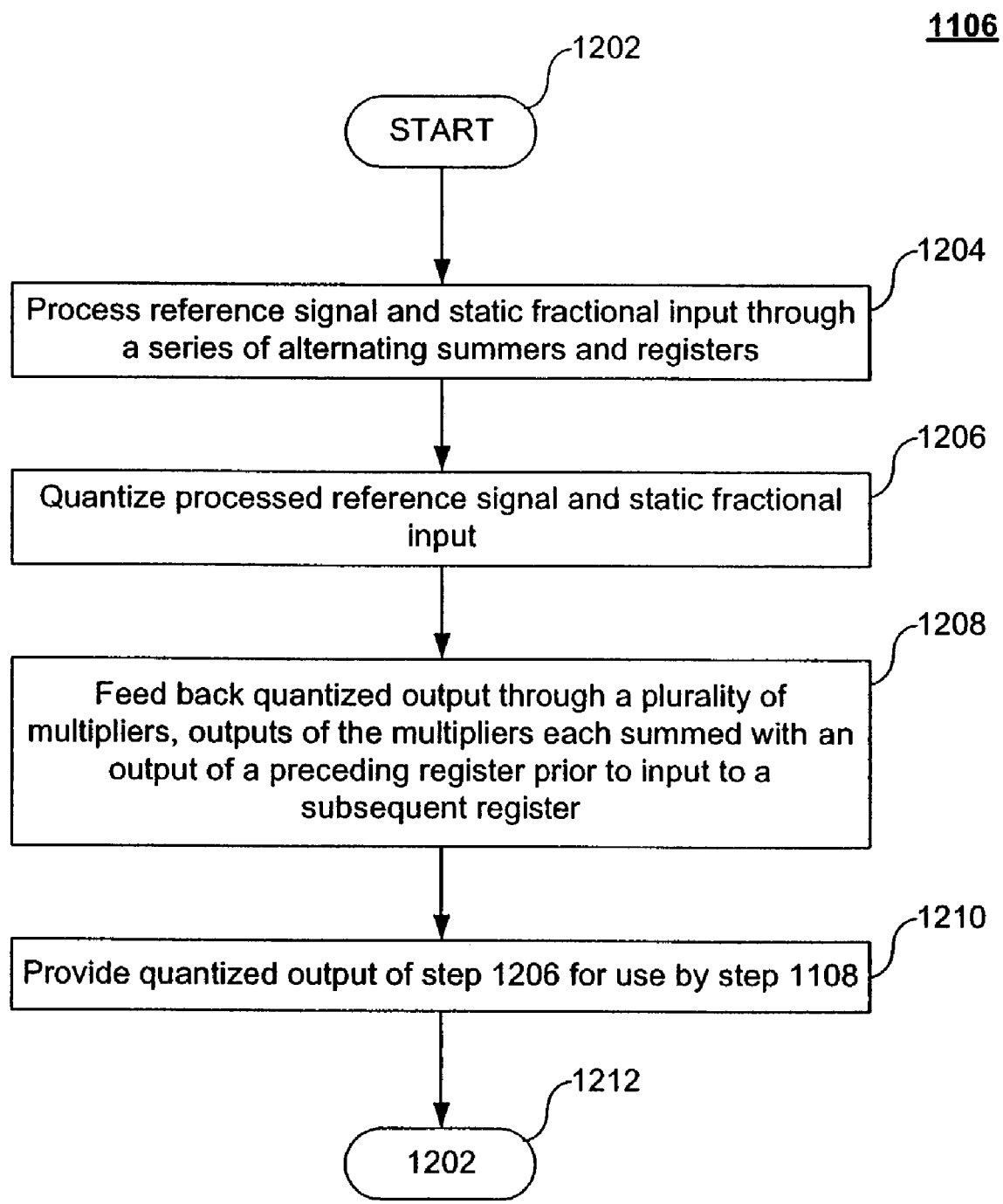
FIG. 12 illustrates fine tuning the first local oscillator signal using a delta sigma modulator according to embodiments of the present invention.
Figure 13:
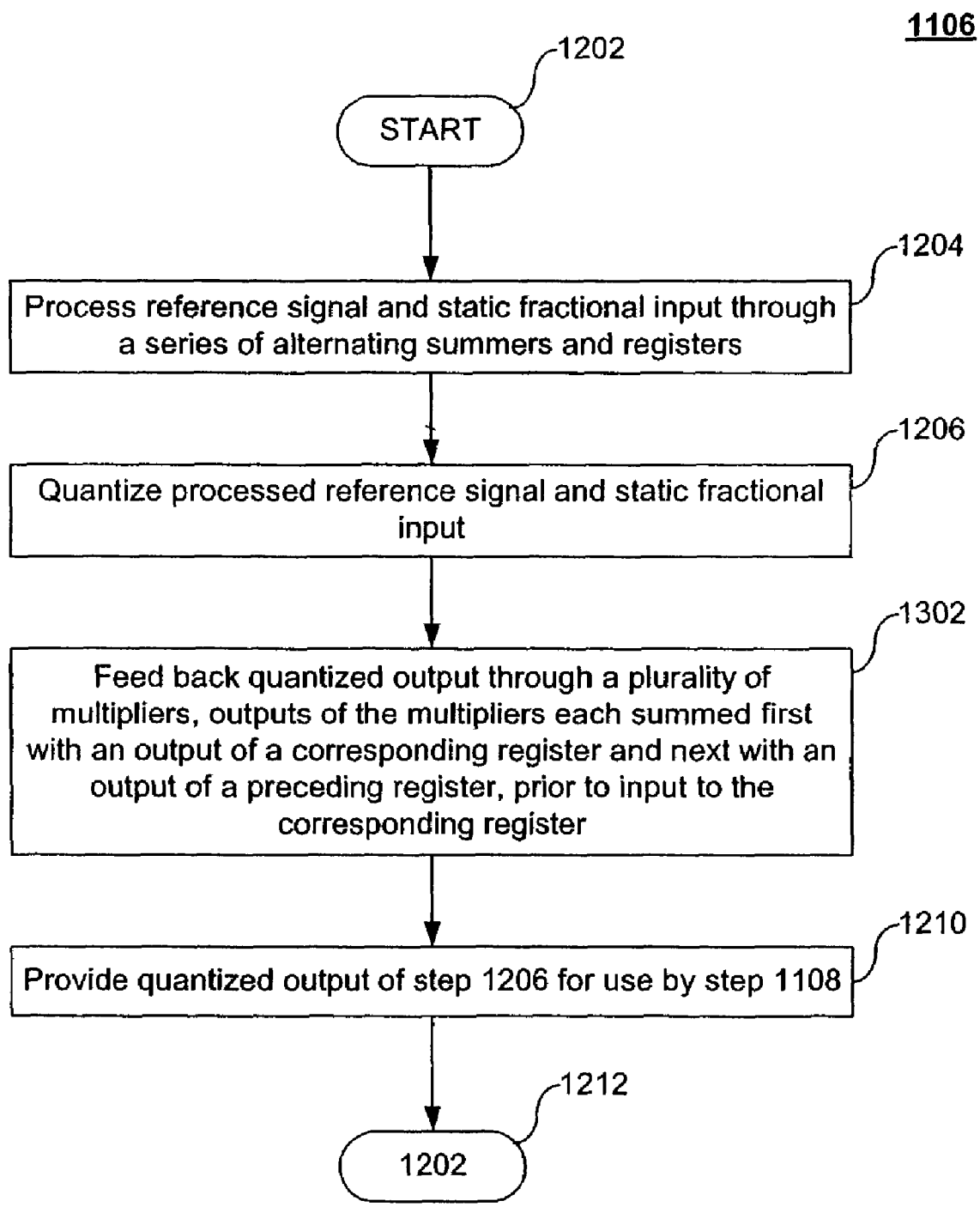
FIG. 13 illustrates another embodiment of fine tuning the first local oscillator signal using a delta sigma modulator according to embodiments of the present invention.

Modulation step 1106 is further illustrated in FIG. 12. The modulation method starts at step 1202, and then immediately proceeds to step 1204. In step 1204, the reference signal and static fractional input are processed through a series of alternating summers and registers. In step 1206, the result of step 1204 is quantized into a finite number of distinct values. In one embodiment of the invention, the distinct values are –1, 0, and 1 to simplify the process and require less hardware. In step 1208, this result is fed back through a plurality of multipliers which each correspond to a register of the alternating summers and registers, the outputs of which are each summed with an output of a preceding register, prior to input to the corresponding register. In step 1210, the result of step 1206 is provided for use by step 1108. Process 1106 is then repeated at step 1212, starting back at step 1202. In an alternative embodiment, process 1106 is as depicted in FIG. 13 where, in step 1302, the outputs of the multipliers are each summed first with an output of the corresponding register and then with an output of the preceding register, prior to input to the corresponding register.

CONCLUSION

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A double-conversion tuner, comprising:
an input for receiving an RF signal having a number of channels;
a first mixer configured to up-convert said RF signal to a first IF signal using a first local oscillator signal;
a first local oscillator having a delta-sigma fractional-N phase lock loop to produce said first local oscillator signal, said delta-sigma fractional-N phase lock loop configured to perform fine tuning of said first local oscillator signal and configured to have a wide tuning range sufficient to cover said number of channels, and said delta-sigma fractional-N phase lock loop including
a feedback path having a programmable frequency divider, and
a delta-sigma modulator configured to receive a static fractional input and generate an output having a plurality of pulses that when averaged over time have an amplitude corresponding to said static fractional input, said delta-sigma modulator including
a series of registers with a summer in-between adjacent registers,
a slicer configured to quantize an output of a last register in said series of registers so as to produce an integer at an output of said slicer, and
a plurality of multipliers configured to multiply said output of said slicer by a series of coefficients, outputs of said plurality of multipliers coupled to inputs of said summers that are in-between said adjacent registers;
a bandpass filter configured to select a subset of channels from said first IF signal;
a second mixer configured to down-convert said subset of channels to a second IF signal using a second local oscillator signal; and
a second local oscillator configured to generate said second local oscillator signal, and configured to perform coarse frequency tuning and have a narrow tuning range relative to said first local oscillator.

2. The double-conversion tuner of claim 1, wherein said delta-sigma modulator output is summed with an integer data value and arranged to control said programmable frequency divider.

3. The double-conversion tuner of claim 1, wherein said delta-sigma modulator output is summed with a periodic bit stream including at least one of (0,+1) and (0,–1) data values and arranged to control said programmable frequency divider.

4. The double-conversion tuner of claim 1, wherein said delta-sigma modulator output is summed with an integer data value and with a periodic bit stream including at least one of (0,+1) and (0,–1) data values and arranged to control said programmable frequency divider.

5. The double-conversion tuner of claim 1, wherein said delta-sigma modulator further includes:
additional summers, each having one input coupled to an output of a corresponding multiplier of said plurality of multipliers and a second input coupled to an output of a corresponding register of said series of registers, an output of each of said additional summers coupled to said inputs of said summers that are in-between said adjacent registers.

6. The double-conversion tuner of claim 1, wherein said output of said slicer is one of –1, 0, and 1.

7. The double-conversion tuner of claim 1, wherein said delta-sigma modulator utilizes at least three levels of quantization.

8. The double conversion tuner of claim 1, further comprising:
a second bandpass filter configured to select a desired channel from said subset of channels in said second IF signal.

9. The double-conversion tuner of claim 1, wherein said second local oscillator includes an integer-N phase lock loop.

10. The double-conversion tuner of claim 1, wherein said delta-sigma fractional-N phase lock loop includes a high-order loop filter to suppress modulation noise at high frequencies.

11. The double conversion tuner of claim 1, wherein said delta-sigma fractional-N phase lock loop is configured to reduce phase noise of said double conversion tuner, and wherein said second local oscillator is configured to reduce unwanted spurious signals of said double conversion tuner.

12. A double-conversion tuner, comprising:
an input for receiving an RF signal having a number of channels;
a first mixer configured to up-convert said RF signal to a first IF signal using a first local oscillator signal;
a first local oscillator having a delta-sigma fractional-N phase lock loop to produce said first local oscillator signal, said delta-sigma fractional-N phase lock loop configured to perform fine tuning of said first local oscillator signal and configured to have a wide tuning range sufficient to cover said number of channels, and said delta-sigma fractional-N phase lock loop including
a feedback path having a programmable frequency divider, and
a delta-sigma modulator configured to receive a static fractional input and generate an output having a plurality of pulses that when averaged over time have an amplitude corresponding to said static fractional input, said delta-sigma modulator including
an input multiplier at an input to said delta-sigma modulator, said input multiplier configured to multiply said static fractional input by a coefficient,
a series of stages, each stage including
a first summer,
a second summer,
a register, and
a stage multiplier, and
a slicer configured to quantize an output of a last register of a last stage of said series of stages so as to produce an integer at an output of said slicer,
wherein said stage multiplier is configured to multiply an output of said slicer by a coefficient, output of said stage multiplier coupled to an input of said first summer, output of said first summer coupled to an input of said second summer, output of said second summer coupled to an input of said register, output of said register coupled to said input of said first summer and an input of a subsequent stage, and output of said input multiplier coupled to an input of a first stage of said series of stages;
a bandpass filter configured to select a subset of channels from said first IF signal;
a second mixer configured to down-convert said subset of channels to a second IF signal using a second local oscillator signal; and
a second local oscillator configured to generate said second local oscillator signal, and configured to perform coarse frequency tuning and have a narrow tuning range relative to said first local oscillator.

13. The double-conversion tuner of claim 12, wherein said delta-sigma modulator output is summed with an integer data value and arranged to control said programmable frequency divider.

14. The double-conversion tuner of claim 12, wherein said delta-sigma modulator output is summed with a periodic bit stream including at least one of (0,+1) and (0,−1) data values and arranged to control said programmable frequency divider.

15. The double-conversion tuner of claim 12, wherein said delta-sigma modulator output is summed with an integer data value and with a periodic bit stream including at least one of (0,+1) and (0,−1) data values and arranged to control said programmable frequency divider.

16. The double conversion tuner of claim 12, further comprising:
a second bandpass filter configured to select a desired channel from said subset of channels in said second IF signal.

17. A method of receiving an RF signal, the method comprising the steps of:
(a) receiving an input RF signal having a number of channels;
(b) generating a first local oscillator signal;
(c) fine-tuning said first local oscillator signal, said fine-tuning including:
(i) receiving a reference signal and a static fractional input,
(ii) modulating said reference signal with said static fractional input to generate an averaged output having a plurality of pulses that when averaged over time have an amplitude corresponding to said static fractional input, said modulating step including
processing said reference signal and said static fractional input through a series of alternating summers and registers,
quantizing the result of the processing step to produce said averaged output, and
multiplying said averaged output by a plurality of coefficients,
(iii) summing said averaged output with a value,
(iv) dividing the frequency of said first local oscillator signal by said summed output of step (iii), and
(v) comparing said divided first local oscillator signal with said reference signal;
(d) up-converting said input RF signal to a first IF signal using said first local oscillator signal;
(e) filtering said first IF signal to select a subset of channels from said first IF signal;
(f) generating a second local oscillator signal;
(g) coarsely-tuning said second local oscillator signal relative to said fine-tuning of step (c); and
(h) down-converting said subset of channels to a second IF signal using said second local oscillator signal.

18. The method of claim 17, further comprising summing outputs of said multiplying step with an output of a corresponding register of said alternating summers and registers prior to summing with an output of a preceding register.

19. The method of claim 17, wherein said averaged output is one of −1, 0, and 1.

20. The method of claim 17, wherein the modulation step uses at least three levels of quantization in order to obtain a fractional frequency intermediate between a highest and lowest integer frequency.

21. The method of claim 17, suppressing modulation noise generated during said modulation step.

22. The method of claim 17, wherein said summing step includes
summing said averaged output with a periodic bit stream including at least one of (0,+1) and (0,−1) data values.

23. The method of claim 17, wherein said summing step includes
summing said averaged output with an integer data value and with a periodic bit stream including at least one of (0,+1) and (0,−1) data values.

24. The method of claim 17, wherein the method further comprises filtering of said second IF signal to select a desired channel from said subset of channels in said second IF signal.

25. The method of claim 17, wherein said first local oscillator signal is generated by a delta-sigma fractional-N phase lock loop.

26. The method of claim 17, wherein said second local oscillator signal is generated by an integer-N phase lock loop.

27. The method of claim 17, wherein said summing step includes summing said averaged output with an integer data value.

28. A method of receiving an RF signal, the method comprising the steps of:
receiving an input RF signal having a number of channels;
up-converting said input RF signal to a first IF signal using a first local oscillator signal;
filtering said first IF signal to determine a selected channel from said first IF signal;
down-converting said selected channel to a second IF signal using a second local oscillator signal; and
fine tuning said selected channel by adjusting said first local oscillator signal, and coarse tuning said selected channel by adjusting said second local oscillator signal, said fine-tuning step including:
  (i) receiving a reference signal and a static fractional input,
  (ii) modulating said reference signal with said static fractional input to generate an averaged output having a plurality of pulses that when averaged over time have an amplitude corresponding to said static fractional input, said modulating step including
    processing said reference signal and said static fractional input through a series of alternating summers and registers,
    quantizing the result of the processing step to produce said averaged output, and
    multiplying said averaged output by a plurality of coefficients,
  (iii) summing said averaged output with a value,
  (iv) dividing the frequency of said first local oscillator signal by said summed output of step (iii), and
  (v) comparing said divided first local oscillator signal with said reference signal.

29. The method of claim 28, further comprising the steps: generating said first local oscillator signal so as to reduce phase noise; and generating said second local oscillator signal so as to reduce unwanted spurious signals.

* * * * *